(12) United States Patent
Ichikawa et al.

(10) Patent No.: US 12,173,881 B2
(45) Date of Patent: Dec. 24, 2024

(54) LAMP UNIT

(71) Applicant: KOITO MANUFACTURING CO., LTD., Tokyo (JP)

(72) Inventors: Tomoyuki Ichikawa, Shizuoka (JP); Tetsuya Suzuki, Shizuoka (JP); Akio Shoji, Shizuoka (JP); Yoshimasa Murata, Shizuoka (JP); Ryota Fuwa, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 18/573,235

(22) PCT Filed: Jun. 10, 2022

(86) PCT No.: PCT/JP2022/023507
§ 371 (c)(1),
(2) Date: Dec. 21, 2023

(87) PCT Pub. No.: WO2023/276620
PCT Pub. Date: Jan. 5, 2023

(65) Prior Publication Data
US 2024/0295313 A1 Sep. 5, 2024

(30) Foreign Application Priority Data

Jun. 30, 2021 (JP) ................................ 2021-109305
Jul. 27, 2021 (JP) ................................ 2021-122707

(51) Int. Cl.
*F21V 23/06* (2006.01)
*F21S 41/143* (2018.01)
(Continued)

(52) U.S. Cl.
CPC ............ *F21V 23/06* (2013.01); *F21S 41/143* (2018.01); *F21S 45/47* (2018.01); *F21S 41/19* (2018.01)

(58) Field of Classification Search
CPC .......... F21S 41/19; F21S 41/143; F21S 45/47; F21V 23/06; F21V 29/508
See application file for complete search history.

(56) References Cited

U.S. PATENT DOCUMENTS

2013/0250599 A1* 9/2013 Owada .................... F21S 41/25
362/520

FOREIGN PATENT DOCUMENTS

| DE | 212019000426 U1 * | 8/2021 | ............. F21S 41/19 |
| EP | 1898144 A2 * | 3/2008 | ............. F21K 9/00 |

(Continued)

OTHER PUBLICATIONS

Innovation Q+ NPL Search (Year: 2024).*
(Continued)

*Primary Examiner* — Anabel Ton
(74) *Attorney, Agent, or Firm* — Sughrue Mion, PLLC

(57) ABSTRACT

A lamp unit including a light emitting element, a lighting circuit, a substrate, and a heat dissipation member. The substrate includes a substrate main body, an external connector insertion portion, and a light emitting element installation portion, the heat dissipation member being provided in the substrate main body. The lighting circuit is mounted on the substrate main body, the lighting circuit being electrically connected with the light emitting element. The light emitting element is mounted on the substrate main body via the light emitting element installation portion, in a state of being in contact with the heat dissipation member.

6 Claims, 5 Drawing Sheets

(51) Int. Cl.
    *F21S 41/19*     (2018.01)
    *F21S 45/47*     (2018.01)

(56) References Cited

FOREIGN PATENT DOCUMENTS

| | | | |
|---|---|---|---|
| JP | 2007-59894 A | 3/2007 | |
| JP | 2011-134677 A | 7/2011 | |
| JP | 2021-12867 A | 2/2021 | |
| KR | 10-2018-0088608 A | 8/2018 | |
| WO | WO-2015190431 A1 * | 12/2015 | ............. F21S 43/00 |
| WO | 2021/010461 A1 | 1/2021 | |
| WO | WO-2022239814 A1 * | 11/2022 | |

OTHER PUBLICATIONS

Translation of WO2021010461A1, Espace.net (Year: 2024).*
International Search Report (PCT/ISA/210) dated Aug. 2, 2022, issued by the International Searching Authority in counterpart International Application No. PCT/JP2022/023507.
Written Opinion (PCT/ISA/237) dated Aug. 2, 2022, issued by the International Searching Authority in counterpart International Application No. PCT/JP2022/023507.
Office Action issued on Jun. 21, 2024 by the Japanese Patent Office in corresponding JP Patent Application No. 2021-109305.

* cited by examiner

LAMP UNIT

CROSS-REFERENCE TO RELATED APPLICATIONS

This application is a National Phase Entry of PCT International Application No. PCT/JP2022/023507 filed on Jun. 10, 2022, which claims priority to Japanese Patent Application No. 2021-109305 filed on Jun. 30, 2021, and Japanese Patent Application No. 2021-122707 filed on Jul. 27, 2021, the contents of all of which are incorporated herein by reference in their entirety.

TECHNICAL FIELD

The present invention relates to a low-cost lamp unit including a heat dissipation member-attached substrate which includes a light emitting element and a lighting circuit.

BACKGROUND ART

Patent Literature 1 discloses a light source unit in which a light emitting element and a flexible printed circuit board are mounted on a metal plate, and a part of the flexible printed circuit board is connected, as a male connector, to a power source-side connector (female side).

CITATION LIST

Patent Literature

Patent Literature 1: JP2021-12867A

SUMMARY OF INVENTION

Technical Problem

In the light source unit of Patent Literature 1, since the light source unit and a lighting circuit are separately formed, an LED unit increases in size and is complicated. Further, in the light source unit of Patent Literature 1, there is a problem that the flexible printed circuit board or the LED is likely to be peeled from the metal plate when inserting and removing a connector forming portion from the power source-side connector.

In view of the above problems, the present application provides a lamp unit including a light emitting element, a lighting circuit, and a heat dissipation metal member in which a connector-attached mounting substrate or a mounting component is less likely to be peeled off from the heat dissipation metal member while downsizing and simplifying the lamp unit.

Solution to Problem

According to the present disclosure, the following is provided.

(1) A lamp unit including:
a light emitting element;
a lighting circuit;
a substrate; and
a heat dissipation member,
in which the substrate includes a substrate main body, an external connector insertion portion, and a light emitting element installation portion, the heat dissipation member being provided in the substrate main body, the lighting circuit is mounted on the substrate main body, the lighting circuit being electrically connected with the light emitting element, and
the light emitting element is mounted on the substrate main body via the light emitting element installation portion, in a state of being in contact with the heat dissipation member.

(2) The lamp unit according to (1),
in which the external connector insertion portion is formed to protrude from an outer peripheral edge portion of the substrate main body, and
the heat dissipation member is provided only on a back surface of the substrate main body.

(3) The lamp unit according to (1) or (2),
in which the light emitting element installation portion is a through hole penetrating the substrate from a front side to a back side of the substrate, and
the light emitting element is provided inside the light emitting element installation portion.

(4) A lamp unit including:
a light emitting element;
a lighting circuit;
a substrate; and
a heat dissipation member,
in which the substrate includes a substrate main body, and an external connector insertion portion, the heat dissipation member being provided only on a back surface of the substrate main body,
the lighting circuit is mounted on the substrate main body, the lighting circuit being electrically connected to the light emitting element via a metal conductive pattern disposed on a front surface of the substrate main body, in a state of being covered with an insulating resist, and
the external connector insertion portion includes an outer peripheral edge portion that is defined via a cutout portion, the external connector insertion portion being formed inside an outer frame of the substrate main body.

(5) The lamp unit according to (4),
in which the substrate main body includes a first component group mounting region defined on one end side of the external connector insertion portion, and a second component group mounting region defined on an other end side of the external connector insertion portion,
at least one first electronic component is mounted in the first component group mounting region of the substrate main body, the at least one first electronic component being a noise-compatible component, and
at least one second electronic component is mounted in the second component group mounting region of the substrate main body, the at least one second electronic component being a noise-incompatible component.

(6) The lamp unit according to (4) or (5),
in which an opening portion is provided in a part of the insulating resist covering the conductive pattern, and
the lamp unit further includes a check land that is the conductive pattern exposed through the opening portion.

(7) The lamp unit according to (4) or (6),
in which the light emitting element includes a light emitting portion, a light emitting substrate, and a terminal portion,
the light emitting substrate includes a step portion on a back surface side of the light emitting substrate, and
the light emitting element is mounted on the substrate main body, via a light emitting element installation portion provided on the substrate, in a state where a back surface of the light emitting substrate is in contact with the heat dissipation member.

A lamp unit including: a light emitting element; a lighting circuit; a substrate; and a heat dissipation member, in which the substrate includes a substrate main body, an external connector insertion portion, and a light emitting element installation portion, the heat dissipation member being provided in the substrate main body, the lighting circuit is mounted on the substrate main body, the lighting circuit being electrically connected with the light emitting element, and the light emitting element is mounted on the substrate main body via the light emitting element installation portion, in a state of being in contact with the heat dissipation member.

(Operation) The lighting circuit is mounted on the heat dissipation member via the substrate main body, and the light emitting element electrically connected to the lighting circuit on the substrate is directly mounted on the heat dissipation member via the light emitting element installation portion. The heat dissipation member is provided on the substrate main body, and only the external connector insertion portion on which the heat dissipation member is not provided is inserted into and removed from a power supply connector which is not shown.

In the lamp unit, it is preferable that the external connector insertion portion is formed to protrude from an outer peripheral edge portion of the substrate main body, and the heat dissipation member is provided only on a back surface of the substrate main body.

(Operation) Only the external connector insertion portion protruding from the outer peripheral edge portion of the substrate main body is inserted into and removed from a power source-side connector, and the heat dissipation member provided only on the back surface of the substrate main body does not come into contact with the power source-side connector.

In the lamp unit, it is preferable that the light emitting element installation portion is a through hole penetrating the substrate from a front side to a back side of the substrate, and the light emitting element is provided inside the light emitting element installation portion.

(Operation) The light emitting element is installed to be recessed inward of the light emitting element installation portion, and heat generated in the light emitting element during light emission is directly transferred to the heat dissipation member.

According to an aspect, a lamp unit including: a light emitting element; a lighting circuit; a substrate; and a heat dissipation member, in which the substrate includes a substrate main body, and an external connector insertion portion, the heat dissipation member being provided only on a back surface of the substrate main body, the lighting circuit is mounted on the substrate main body, the lighting circuit being electrically connected to the light emitting element via a metal conductive pattern disposed on a front surface of the substrate main body, in a state of being covered with an insulating resist, and the external connector insertion portion includes an outer peripheral edge portion that is defined via a cutout portion, the external connector insertion portion being formed inside an outer frame of the substrate main body.

(Operation) In these aspects, since the entire outer peripheral edge portion of the external connector insertion portion is formed inside the outer frame of the substrate main body via the cutout portion, a vertical dimension of the lamp unit is shortened. Further, the heat dissipation member is provided only on the back surface of the substrate main body, and only the external connector insertion portion on which the heat dissipation member is not provided is inserted into and removed from the power source connector which is not shown.

According to an aspect, the substrate main body includes a first component group mounting region defined on one end side of the external connector insertion portion, and a second component group mounting region defined on an other end side of the external connector insertion portion, at least one first electronic component is mounted in the first component group mounting region of the substrate main body, the at least one first electronic component being a noise-compatible component, and at least one second electronic component is mounted in the second component group mounting region of the substrate main body, the at least one second electronic component being a noise-incompatible component.

(Operation) According to these aspects, since the external connector insertion portion is located inside the outer frame of the substrate main body, even if an electronic component mountable area on the substrate main body is narrow, the second electronic component, which is a noise-incompatible component, is disposed apart from the first electronic component group which generates noise, and thus is less susceptible to noise.

According to an aspect, an opening portion is provided in a part of the insulating resist covering the conductive pattern, and the lamp unit further includes a check land that is the conductive pattern exposed through the opening portion.

(Operation) In these aspects, the check land is formed in the conductive pattern for electrically connecting the lighting circuit and the light emitting element.

According to an aspect, the light emitting element includes a light emitting portion, a light emitting substrate, and a terminal portion, the light emitting substrate includes a step portion on a back surface side of the light emitting substrate, and the light emitting element is mounted on the substrate main body via a light emitting element installation portion provided on the substrate, in a state where a back surface of the light emitting substrate is in contact with the heat dissipation member.

(Operation) In these aspects, the light emitting substrate of the light emitting clement is fixed to the front surface of the heat dissipation member by an adhesive. At the time of fixing, even if the adhesive leaking from between the back surface of the light emitting substrate and the front surface of the heat dissipation member flows onto an outer peripheral surface of the light emitting substrate, the adhesive is retained at the step portion.

The lamp unit in which the vertical dimension is made compact is obtained, and the substrate or the mounting component on the substrate is less likely to be peeled off from the heat dissipation member when the external connector insertion portion is inserted into and removed from the power source-side connector.

Further, the second electronic component, which is mounted on the substrate main body and is a noise-incompatible component, is disposed apart from the first electronic component group which generates noise, and thus is less susceptible to noise.

Further, since a part of the conductive pattern can be used as the check land, there is no need to provide a separate check land installation space on the substrate main body, and a compact lamp unit can be obtained.

Further, even if the adhesive used to fix the light emitting substrate to the heat dissipation member leaks from between the heat dissipation member and the light emitting substrate and flows onto the outer peripheral surface of the light emitting substrate, the adhesive is retained at the step portion, and thus does not flow to the light emitting portion. That is, even if the adhesive leaks, the adhesive does not cover the light emitting portion and does not interfere with light emission.

Advantageous Effects of Invention

As is apparent from the above description, according to the present disclosure, by integrating the light emitting element, the lighting circuit, and the substrate, the lamp unit can be downsized and simplified. Further, by inserting and removing only the external connector insertion portion from the power source-side connector, a connector-attached substrate or a mounting component is less likely to be peeled off from the heat dissipation member at the time of insertion and removal.

DESCRIPTION OF EMBODIMENTS

Hereinafter, a preferred embodiment of the present invention will be described with reference to FIGS. 1 and 2. In each drawing, each direction of a printed circuit board is described as (front surface side: back surface side: left end side: right end side: tip end side: base end side=Fr: Re: Le: Ri: Lo: Up).

Figure 1:
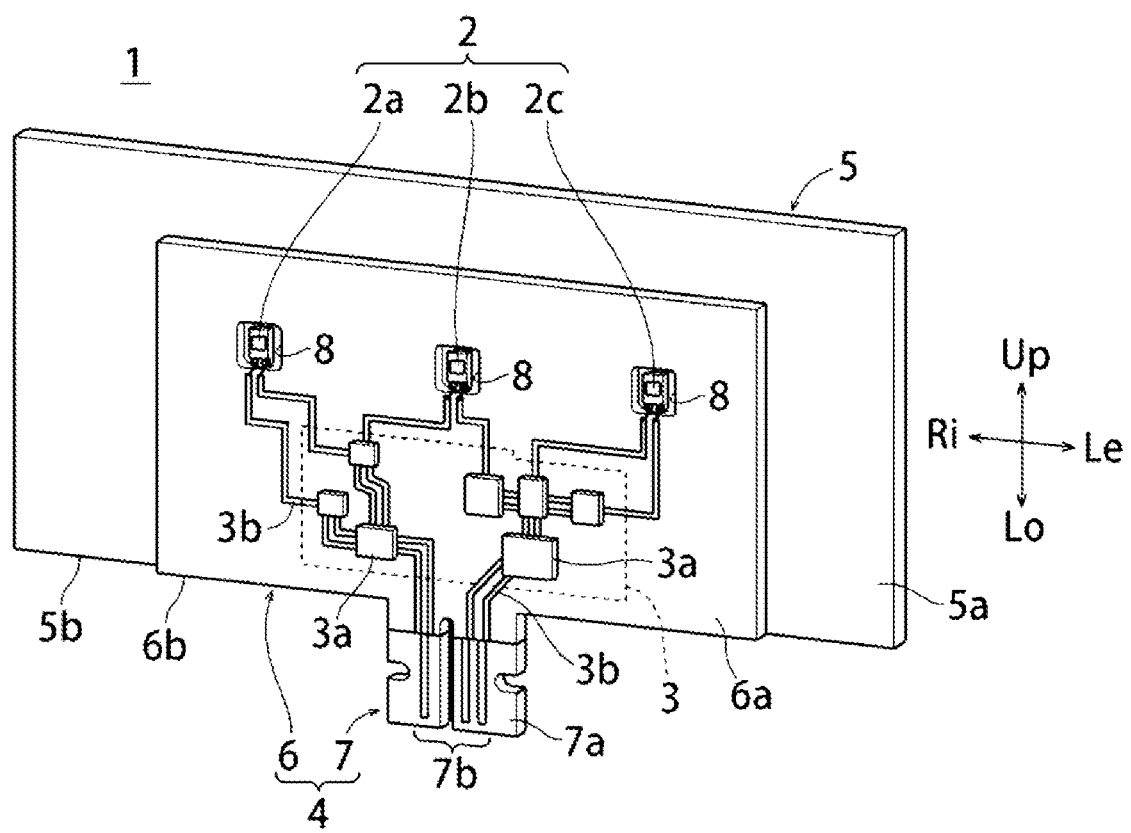
FIG. 1 is a perspective view of a lamp unit of the present embodiment as viewed from a front surface side of a glass epoxy substrate.
Figure 2:
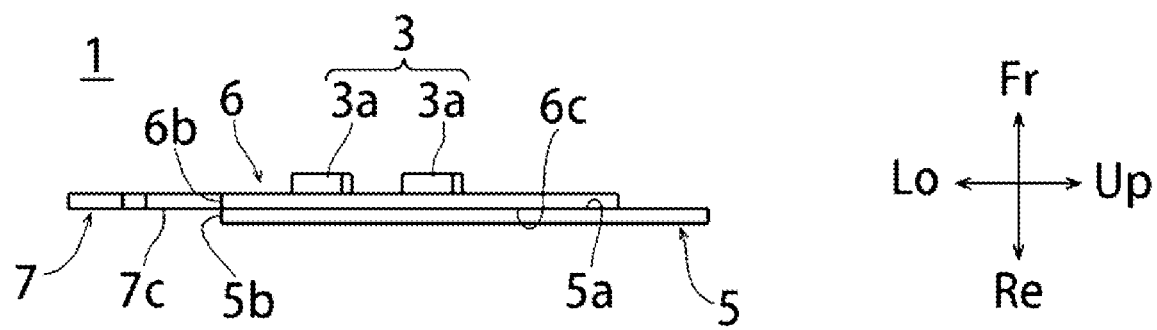
FIG. 2 is a left side view of the lamp unit of the present embodiment rotated counterclockwise by 90°.

As shown in FIGS. 1 and 2, a lamp unit 1 includes an LED 2 that is a light emitting element group including a plurality of light emitting elements, a lighting circuit 3, a glass epoxy substrate 4, and an aluminum plate 5 which is a heat dissipation member.

The LED 2 shown in FIG. 1 includes a low beam LED 2a, a high/low beam LED 2b, and a high beam LED 2c. The low beam LED 2a is configured to display a light converging region in a low beam light distribution pattern of a vehicle (not shown) on which the lamp unit 1 is mounted. The high/low beam LED 2b is configured to display both diffusion regions in the low beam light distribution pattern and a high beam light distribution pattern. The high beam LED 2c is configured to display a high beam light distribution pattern, together with the high/low beam LED 2b. The light emitting element is not limited to an LED, and may be a laser diode or the like, the light emitting elements constituting the LED 2 may be a single light emitting element, two light emitting elements, or a light emitting element group including four or more light emitting elements.

As shown in FIGS. 1 and 2, the lighting circuit 3 includes many electronic components 3a electrically connected to one another via metal conductive patterns 3b. The glass epoxy substrate 4 is formed by a substrate main body 6 and an external connector insertion portion 7 that is formed as a card edge connector. As an example, the external connector insertion portion 7 is formed to protrude, in a tip end direction, from a center in a left-right direction of a tip-end-side outer peripheral edge portion 6b of the rectangular plate-shaped substrate main body 6.

As shown in FIGS. 1 and 2, the lighting circuit 3 is mounted on a front surface 6a of the substrate main body 6 of the glass epoxy substrate 4, and metal terminal portions 7b formed on a front surface 7a of the external connector insertion portion 7 are connected with the lighting circuit 3 via the conductive patterns 3b. The external connector insertion portion 7 is connected to an external connector which is not shown, and thus the external connector insertion portion 7 is configured to receive power supply from a power source and a lighting control signal for the LED 2 (a lighting switching signal between the high beam and the low beam or the like).

In this way, only the external connector insertion portion 7 is inserted into and removed from an external connector which is not shown, and thus a mounting component such as the lighting circuit 3 is less likely to peel off from the substrate main body 6 at the time of insertion and removal.

As shown in FIGS. 1 and 2, the rectangular aluminum plate 5, which is the heat dissipation member, is integrated with a back surface 6c of the substrate main body 6 of the glass epoxy substrate 4. The aluminum plate 5 is provided only on the back surface 6c of the substrate main body 6 including the lighting circuit 3, serving as a heat source, on a front surface 6a side, and is not provided on a back surface 7c of the external connector insertion portion 7.

In this way, since the aluminum plate 5 is not provided on the external connector insertion portion 7, the aluminum plate 5 is not inserted into and removed from a power source-side connector (not shown), and no friction is generated between the aluminum plate 5 and the power source-side connector. Therefore, the glass epoxy substrate 4 provided with the external connector insertion portion 7 is less likely to peel off from the aluminum plate 5.

In the present embodiment, an area of a front surface 5a of the aluminum plate 5 is larger than an area of the back surface 6c of the substrate main body 6. Further, the aluminum plate 5 is integrated with the back surface 6c of the substrate main body 6 with a tip-end-side outer peripheral edge portion 5b flush with the tip-end-side outer peripheral edge portion 6b of the substrate main body 6. In this way, by protruding the aluminum plate 5 from an outer peripheral edge portion of the substrate main body 6 to the left and right and a base end side, a total surface area of the aluminum plate 5 is increased, thereby improving the heat dissipation effect. The area of the front surface 5a of the aluminum plate 5 may be the same as the surface area of the back surface 6c of the substrate main body 6, and the aluminum plate 5 may be formed only on an entire back surface 6c of the substrate main body 6. In this case, a size of the lamp unit 1 can be made the most compact by fitting the aluminum plate 5 on an inner side of the outer peripheral edge portion of the substrate main body 6, and the maximum cooling effect for the substrate main body 6 can be exerted by providing the aluminum plate 5 over the entire back surface 6c of the substrate main body 6.

The LED 2 and light emitting element installation portions 8 of the glass epoxy substrate 4 will be described with reference to FIGS. 1 and 3. First, in the present embodiment, the low beam LED 2a, the high/low beam LED 2b, and the high beam LED 2c included in the LED 2 all have the same configuration. The LEDs 2a to 2c may be configured such that sizes of light emitting portions are different, so as to produce different outputs.

The low beam LED 2a will be described with reference to FIG. 3 as an example of the present disclosure. The low beam LED 2a includes a main body portion 2a1, a light emitting portion 2a2, stepped terminal installation portion 2a3, and metal terminal portions 2a4. The main body portion 2a1 and the terminal installation portion 2a3 are formed of ceramic or the like, and the light emitting portion 2a2 is exposed at a tip end side of the main body portion 2a1.

As shown in FIG. 1, the substrate main body 6 of the glass epoxy substrate 4 is provided with three light emitting element installation portions 8 arranged in the left-right direction. As shown in FIG. 3, the light emitting element installation portion 8 has a shape following an outer shape of the low beam LED 2a, the high/low beam LED 2b, and the high beam LED 2c, and is formed as a through hole penetrating from a front surface side to a back surface side. The front surface 5a of the aluminum plate 5 is exposed at a back surface of the light emitting element installation portion 8, and the front surface 5a of the aluminum plate 5 constitutes a bottom surface of the light emitting element installation portion 8.

Figure 3:
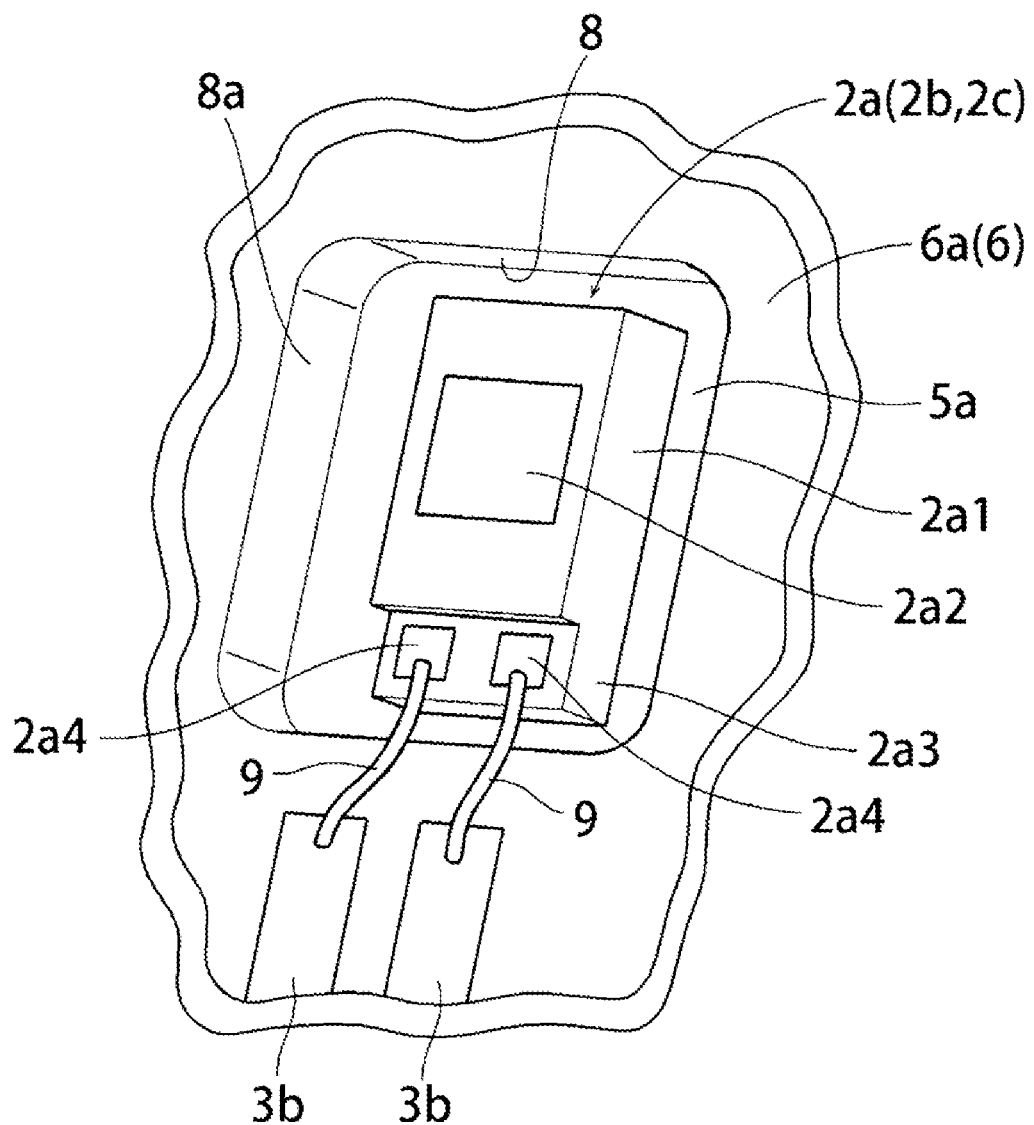
FIG. 3 is an enlarged perspective view of the light emitting element of the present embodiment as viewed from the front surface side of the glass epoxy substrate.

As shown in FIGS. 1 and 3, the low beam LED 2a, the high/low beam LED 2b, and the high beam LED 2c are arranged inside the three light emitting element installation portions 8 in order from the left. The low beam LED 2a, the high/low beam LED 2b, and the high beam LED 2c are arranged on the front surface of the aluminum plate 5 with back surfaces 2d in contact with the front surface of the aluminum plate 5. The low beam LED 2a, the high/low beam LED 2b, and the high beam LED 2c are configured to receive power supply and the lighting control signal from the lighting circuit 3 by electrically connecting the terminal portions 2a4 to the conductive patterns 3b by wire bonds 9.

As shown in FIG. 3, each of the low beam LED 2a, the high/low beam LED 2b, and the high beam LED 2c is directly installed on the front surface of the aluminum plate 5 that is the heat dissipation member, but not on the front surface 6a of the substrate main body 6. Accordingly, heat generated in each LED is quickly dissipated to the aluminum plate 5.

Further, it is desirable that the light emitting portions 2a2 of the low beam LED 2a, the high/low beam LED 2b, and the high beam LED 2c shown in FIG. 3 are each formed to be flush with the front surface 6a of the substrate main body 6, or formed at a position recessed inward of the light emitting element installation portion 8. The light emitting portions 2a2 of the low beam LED 2a, the high/low beam LED 2b, and the high beam LED 2c are installed in this way, each are surrounded by an inner peripheral wall 8a of the light emitting element installation portion 8, are less likely to come into contact with other components and the like when the external connector insertion portion 7 of the glass epoxy substrate 4 is inserted into and removed from the power source-side connector, and thus are less likely to be peeled off from the front surface 5a of the aluminum plate 5.

Figure 4:
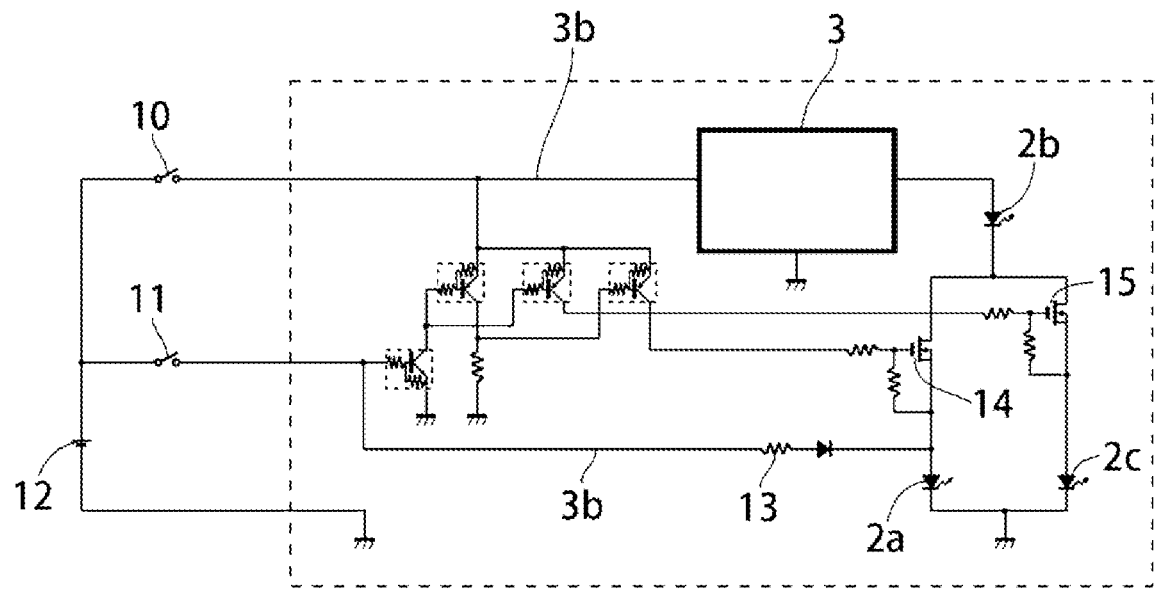
FIG. 4 is a circuit diagram related to an LED and a lighting circuit of the present embodiment.

Next, a lighting mode of the LED 2 of the lamp unit 1 of the present embodiment in a case of being mounted on a vehicle (not shown) as a head lamp will be described with reference to a circuit diagram of FIG. 4. The low beam LED 2a, the high/low beam LED 2b, the high beam LED 2c, and the lighting circuit 3 are connected, via the conductive patterns 3b, to a lighting switch 10, a high beam/low beam changeover switch 11, a battery 12, a resistor 13, a MOS (metal-oxide-semiconductor) 14, and a MOS 15, with a circuit configuration shown in FIG. 4.

In a case where the lighting switch 10 is turned on, power is supplied from the battery 12 to the lighting circuit 3, and the LED 2 emits light based on a mode of the high beam/low beam changeover switch 11. In a case where the lighting switch 10 is turned on and the high beam/low beam changeover switch 11 is turned off, the lighting circuit 3 turns on and off the LED 2 in a mode (low beam setting) in which the low beam distribution pattern is displayed. Specifically, in the low beam setting, since the MOS 14 is turned off and the MOS 15 is turned on, the low beam LED 2a and the high/low beam LED 2b are turned on, and the high beam LED 2c is turned off. As a result, the LED 2 displays a low beam distribution pattern (not shown) by low beam converging light and diffused light.

On the other hand, in a case where the lighting switch 10 is turned on and the high beam/low beam changeover switch 11 is turned on, the lighting circuit 3 turns on and off the LED 2 in a mode (high beam setting) in which the high beam light distribution pattern is displayed. Specifically, in the high beam setting, the MOS 14 is turned on, and the MOS 15 is turned off. In this case, not only the high/low beam LED 2b and the high beam LED 2c are turned on, but also the low beam LED 2a receives a current which is weaker than a lighting current for full lighting via the resistor 13, is turned on with brightness slightly reduced as compared with that at the time of full lighting, and generates low beam converging light.

In the related art, it is necessary to cause a weak current for preventing oxidation to flow through a connector of a signal input portion on the circuit, and the weak current is a wasteful current that does not contribute in any way to lighting the head lamp. However, according to the circuit configuration of FIG. 4, the weak current for preventing oxidation is also used for the weak lighting of the low beam LED 2a at the time of high beam lighting, which has an effect of improving the poor appearance caused by turning off a part of the LEDs 2 when viewed from the front of the vehicle.

By integrating the LED 2, the lighting circuit 3, and the glass epoxy substrate 4, the lamp unit 1 of the present embodiment is excellent in that the lamp unit 1 is not only downsized and simplified, but also achieves the above-mentioned effects.

Figure 5:
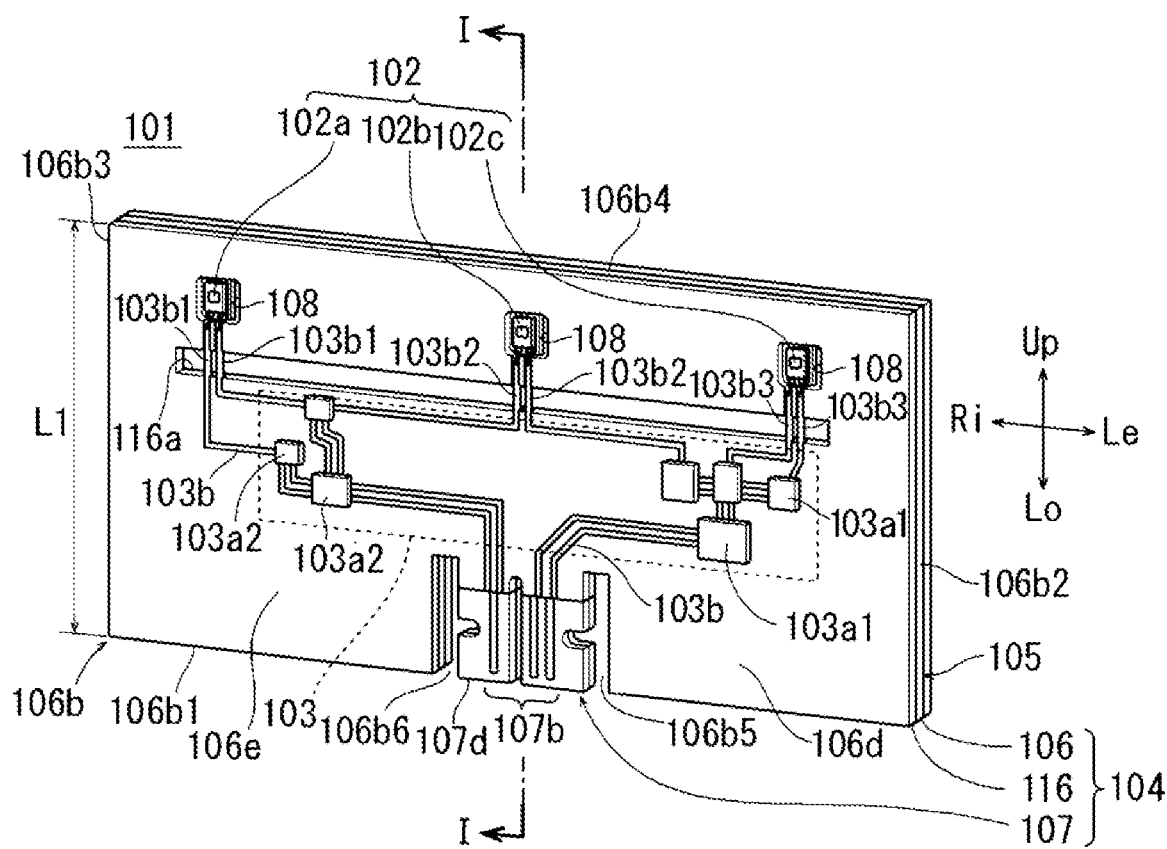
FIG. 5 is a perspective view of a lamp unit of the present embodiment as viewed from a front surface side of a glass epoxy substrate.
Figure 6:
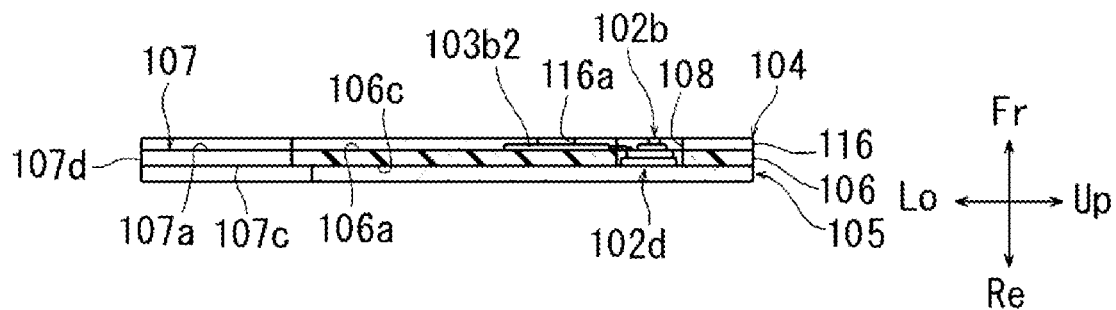
FIG. 6 is a cross-sectional view taken along a line I-I of FIG. 5, in which the lamp unit is cut in a front-rear direction at a position of a high/low beam LED 102b.

As shown in FIGS. 5 and 6, a lamp unit 101 includes an LED 102 that is a light emitting element group including a plurality of light emitting elements, a lighting circuit 103, a glass epoxy substrate 104, and an aluminum plate 105 which is a heat dissipation member.

The LED 102 shown in FIG. 5 includes a low beam LED 102a, a high/low beam LED 102b, and a high beam LED 102c. The low beam LED 102a is configured to display a light converging region in a low beam light distribution pattern of a vehicle (not shown) on which the lamp unit 101 is mounted. The high/low beam LED 102b is configured to display both diffusion regions in the low beam light distribution pattern and a high beam light distribution pattern. The high beam LED 102c is configured to display a high beam light distribution pattern, together with the high/low beam LED 102b. The light emitting element is not limited to an LED 102, and may be a laser diode or the like, the light emitting elements included in the LED 102 may be a single light emitting element, two light emitting elements, or a light emitting element group including four or more light emitting elements.

As shown in FIGS. 5 and 6, the lighting circuit 103 includes many first electronic components 103a1 and second electronic components 103a2 electrically connected to one another via metal conductive patterns 103b. The glass epoxy substrate 104 is formed by a rectangular plate-shaped substrate main body 106, an external connector insertion portion 107 formed on a part of the substrate main body 106, and an insulating resist 116 covering front surfaces 106a, 107a of the substrate main body 106 and the external connector insertion portion 107. The insulating resist 116 is made of epoxy resin or the like. The first electronic components 103a1 and the second electronic components 103a2 each may be a single electronic component, two electronic components, or an electronic component group including four or more electronic components.

As shown in FIGS. 5 and 6, the external connector insertion portion 107 is defined in the vicinity of a center portion of a tip-end-side outer peripheral edge portion 106b1 of the substrate main body 106 by forming cutout portions 106b5, 106b6 by performing press-based punching at two locations from the tip-end-side outer peripheral edge portion 106b1 toward a base-end-side outer peripheral edge portion 106b4. When an outer frame 106b of the substrate main body 106 is formed of the tip-end-side outer peripheral edge portion 106b1, a left-end-side outer peripheral edge portion 106b2, a right-end-side outer peripheral edge portion 106b3, and the base-end-side outer peripheral edge portion 106b4, the external connector insertion portion 107 is formed inside the outer frame 106b of the substrate main body 106 in a state where a tip end portion 107d is flush with the tip-end-side outer peripheral edge portion 106b1 of the substrate main body 106. According to the lamp unit 101 of the present embodiment, since the external connector insertion portion 107 does not protrude from the tip-end-side outer peripheral edge portion 106b1 of the substrate main body 106 in a tip end direction, a vertical dimension L1 can be made small.

As shown in FIG. 5, the many first electronic components 103a1 included in the lighting circuit 103 are mounted on a first component group mounting region 106d defined on a left end side of the external connector insertion portion 107 on the substrate main body 106, and similarly, the many second electronic components 103a2 included in the lighting circuit 103 are mounted on a second component group mounting region 106d defined on a right end side of the external connector insertion portion 107 on the substrate main body 106. The many first electronic components 103a1 are components which generate noise, are a group of electronic components that require noise countermeasures for other components, and correspond to, for example, DC/DC converters. Further, the many second electronic components 103a2 are a group of electronic components which are susceptible to noise, and correspond to, for example, a high beam/low beam changeover switch 111 shown in FIG. 9 to be described later.

As shown in FIG. 5, the many second electronic components 103a2 are disposed apart from the many first electronic components 103a1, which generate noise, with the external connector insertion portion 107 sandwiched therebetween. Thus, according to the lamp unit of the present embodiment, there is an advantage that even if the many second electronic components 103a2 which are susceptible to noise are connected to the many first electronic components 103a1 via the conductive patterns 103b, the many second electronic components 103a2 are less susceptible to the noise generated in the first electronic components 103a1.

Metal terminal portions 107b shown in FIG. 5 which are mounted on the front surface 106a of the substrate main body 106 of the glass epoxy substrate 104 and formed on the front surface 107a of the external connector insertion portion 107 are connected with the lighting circuit 103 via the conductive patterns 103b. The external connector insertion portion 107 is connected to an external connector which is not shown, and thus receives power supply from a power source and a lighting control signal for the LED 102 (a lighting switching signal between the high beam and the low beam or the like). In this way, only the external connector insertion portion 107 is inserted into and removed from an external connector which is not shown, and thus a mounting component such as the lighting circuit 103 is less likely to peel off from the substrate main body 106 at the time of insertion and removal.

As shown in FIGS. 5 and 6, the rectangular aluminum plate 105, which is the heat dissipation member, is integrated with a back surface 106c of the substrate main body 106 of the glass epoxy substrate 104. The aluminum plate 105 is provided only on the back surface 106c of the substrate main body 106 including the lighting circuit 103 serving as a heat source on the front surface 106a side, and is not provided on a back surface 107c of the external connector insertion portion 107. In this way, since the aluminum plate 105 is not provided on the external connector insertion portion 107, the aluminum plate 105 is not inserted into and removed from the power source-side connector (not shown), and no friction is generated between the aluminum plate 105 and the power source-side connector, so that the glass epoxy substrate 104 provided with the external connector insertion portion 107 is less likely to be peeled off from the aluminum plate 105.

As shown in FIG. 5, in the insulating resist 116 covering the front surfaces 106a, 107a of the substrate main body 106 and the external connector insertion portion 107, an opening portion 116a penetrating in the front-rear direction is provided on the conductive patterns 103b for connecting the LED 102 to the lighting circuit 103, and the conductive patterns 103b wired on the glass epoxy substrate 104 is exposed forward from the opening portion 116a. Portions of the conductive patterns 103b exposed from the opening portion 116a function as check lands 103b1, 103b2, and 103b3 respectively, and continuity and the like are confirmed.

As shown in FIG. 5, according to the lamp unit 101 of the present embodiment, a part of the conductive patterns 103b can be used as the check lands 103b1, 103b2, and 103b3, and thus there is no need to provide a separate check land installation space on the substrate main body 106, so that the lamp unit 101 which is compact and made at low cost can be obtained.

The LED 102 and light emitting element installation portions 108 of the glass epoxy substrate 104 will be described with reference to FIGS. 5, 7 and 8. First, in the present embodiment, the low beam LED 102a, the high/low beam LED 102b, and the high beam LED 102c constituting the LED 102 all have the same configuration. The LEDs 102*a* to 102*c* may be configured such that sizes of light emitting portions are different, so as to produce different outputs.

The high/low beam LED 102*b* will be described with reference to FIGS. 7 and 8. The high/low beam LED 102*b* includes a light emitting substrate 102*b*1, a light emitting portion 102*b*2, and metal terminal portions 102*b*4. The light emitting substrate 102*b*1 is formed of ceramic or the like, and the light emitting portion 102*b*2 is exposed at a tip end side of the light emitting substrate 102*b*1. Further, a step portion 102*b*5 protruding in a flange shape may be integrally formed on a back surface side of the light emitting substrate 102*b*1.

As shown in FIG. 5, the substrate main body 106 of the glass epoxy substrate 104 is provided with three light emitting element installation portions 108 arranged in the left-right direction. As shown in FIG. 7, the light emitting element installation portion 108 has a shape following an outer shape of the low beam LED 102*a*, the high/low beam LED 102*b*, and the high beam LED 102*c*, and is formed as a through hole penetrating from a front surface side to a back surface side. The front surface 105*a* of the aluminum plate 105 is exposed at a back surface of the light emitting element installation portion 108, and the front surface 105*a* of the aluminum plate 105 configures a bottom surface of the light emitting element installation portion 108.

Figure 7:
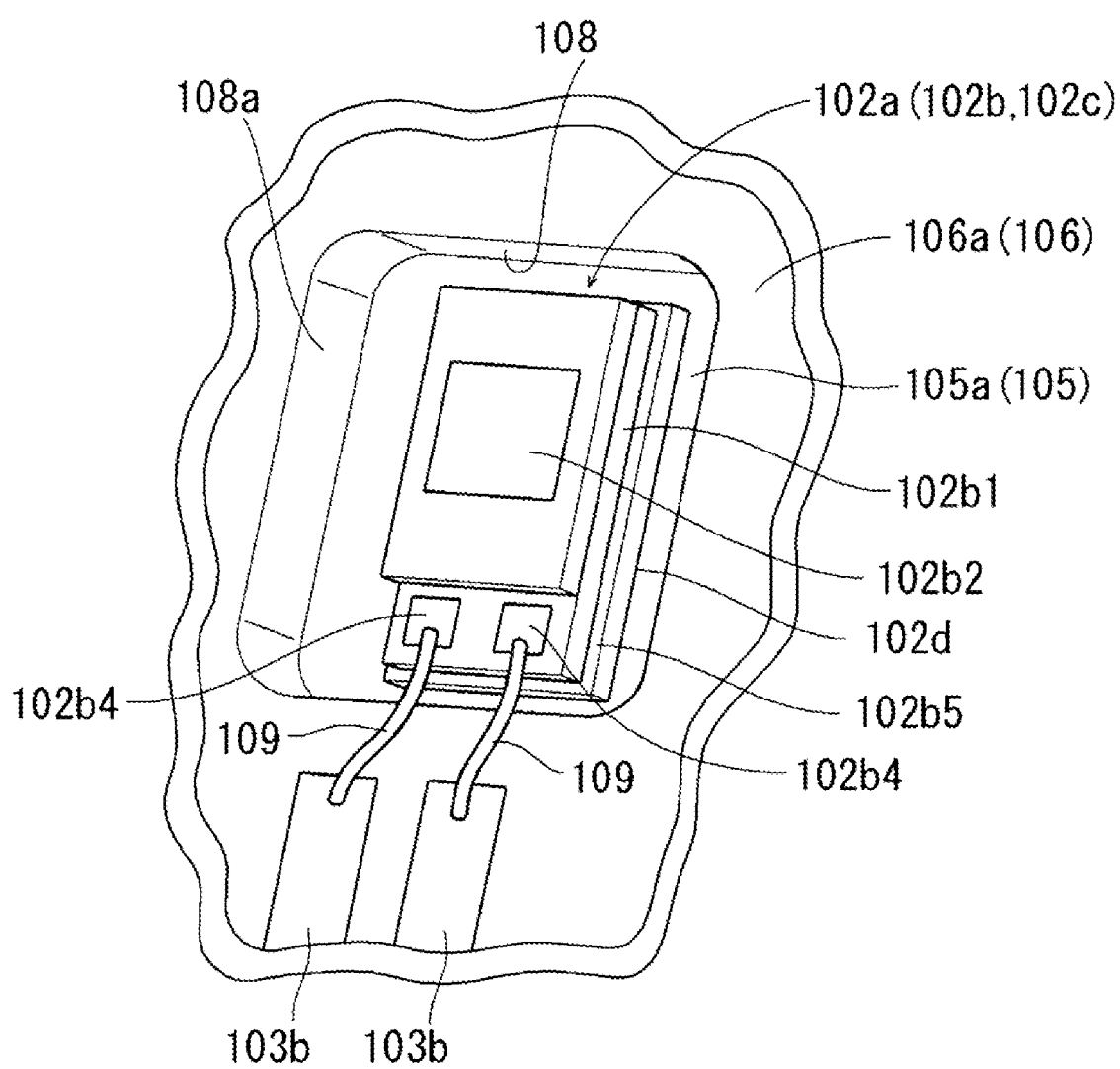
FIG. 7 is an enlarged perspective view of a light emitting element of the present embodiment as viewed from the front surface side of the glass epoxy substrate.
Figure 8:
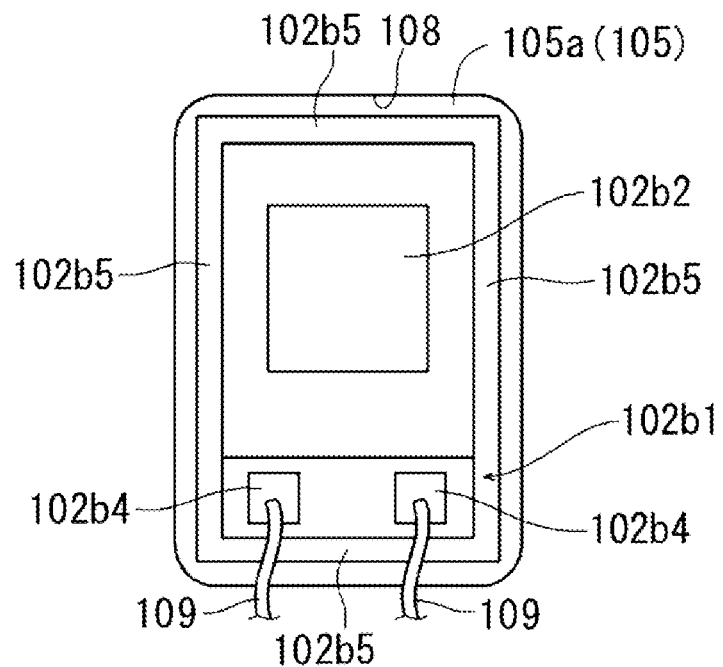
FIG. 8 is a front view of the light emitting element of the present embodiment as viewed from the front surface side of the glass epoxy substrate.

As shown in FIGS. 5 and 7, the low beam LED 102*a*, the high/low beam LED 102*b*, and the high beam LED 102*c* are installed inside the three light emitting element installation portions 108 in order from the left. The low beam LED 102*a*, the high/low beam LED 102*b*, and the high beam LED 102*c* are attached, with an adhesive, on the front surface 105 of the aluminum plate 105 with back surfaces 102*d* in contact therewith. The low beam LED 102*a*, the high/low beam LED 102*b*, and the high beam LED 102*c* each receive power supply and the lighting control signal from the lighting circuit 103 by electrically connecting the terminal portions 102*b*4 to the conductive patterns 103*b* by wire bonds 109.

In the high/low beam LED 102*b* (the same applies to the low beam LED 102*a* and the high beam LED 102*c*) shown in FIGS. 5 to 7, even if the adhesive used to fix the light emitting substrate 102*b*1 to the aluminum plate 105 leaks from between the aluminum plate 105 and the light emitting substrate 102*b*1 and flows onto an outer peripheral surface of the light emitting substrate 102*b*1, the adhesive is retained at the step portion 102*b*5, and thus does not flow to the light emitting portion 102*b*2 on the front surface side. That is, according to the lamp unit 101 of the present embodiment, there is an advantage that even if the adhesive leaks, the leaked adhesive does not cover the light emitting portion 102*b*2 and does not interfere with light emission.

Further, as shown in FIG. 7, each of the low beam LED 102*a*, the high/low beam LED 102*b*, and the high beam LED 102*c* is installed on the front surface of the aluminum plate 105 which is the heat dissipation member, but not directly on the front surface 106*a* of the substrate main body 106, and thus heat generated in each LED is quickly dissipated to the aluminum plate 105.

Further, it is desirable that the light emitting portions 102*b*2 of the low beam LED 102*a*, the high/low beam LED 102*b*, and the high beam LED 102*c* shown in FIG. 7 are each formed to be flush with the front surface 106*a* of the substrate main body 106, or at a position recessed inward of the light emitting element installation portion 108. The light emitting portions 102*b*2 of the low beam LED 102*a*, the high/low beam LED 102*b*, and the high beam LED 102*c* are installed in this way, thus each are surrounded by an inner peripheral wall 108*a* of the light emitting element installation portion 108, and thus are less likely to come into contact with something when the external connector insertion portion 107 of the glass epoxy substrate 104 is inserted into and removed from the power source-side connector, so that the wire bonds 109 are less likely to be cut.

Figure 9:
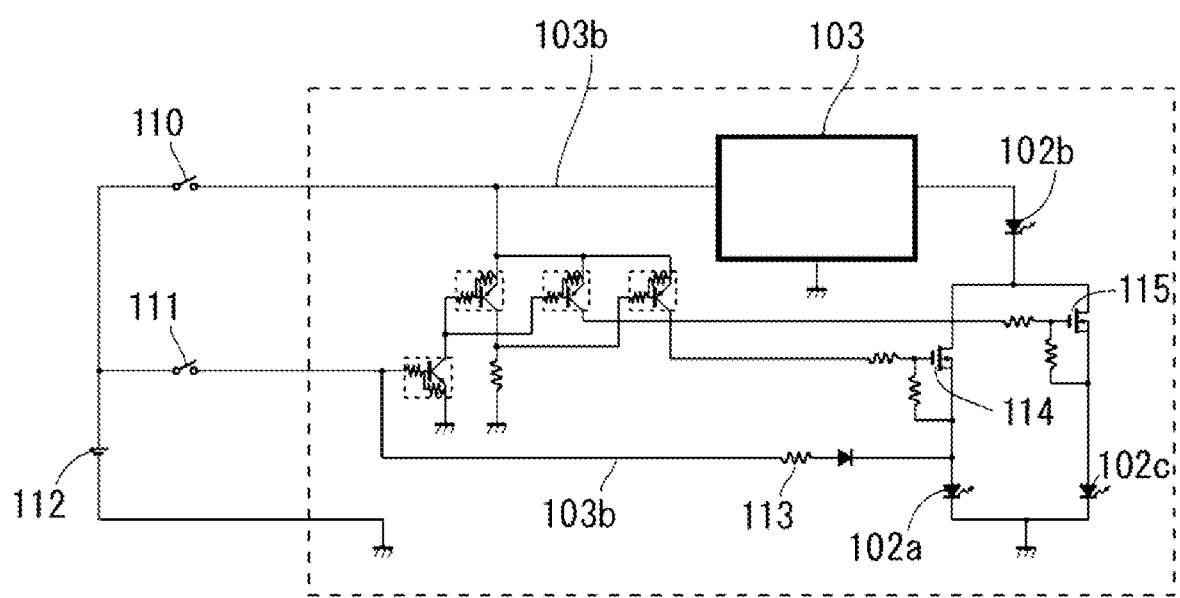
FIG. 9 is a circuit diagram related to an LED and a lighting circuit of the present embodiment.

Next, a lighting mode of the LED 102 of the lamp unit 101 of the present embodiment in a case of being mounted on a vehicle (not shown) as a head lamp will be described with reference to a circuit diagram of FIG. 9. The low beam LED 102*a*, the high/low beam LED 102*b*, the high beam LED 102*c*, and the lighting circuit 103 are connected, via the conductive patterns 103*b*, to a lighting switch 110, a high beam/low beam changeover switch 111, a battery 112, a resistor 113, a MOS (metal-oxide-semiconductor) 114, a MOS 115, and a DC/DC converter (not shown), with a circuit configuration shown in FIG. 8.

In a case where the lighting switch 110 is turned on, power is supplied from the battery 112 to the lighting circuit 103, and the LED 102 emits light based on a mode of the high beam/low beam changeover switch 111. In a case where the lighting switch 110 is turned on and the high beam/low beam changeover switch 111 is turned off, the lighting circuit 103 turns on and off the LED 102 in a mode (low beam setting) in which the low beam distribution pattern is displayed. Specifically, in the low beam setting, since the MOS 114 is turned off and the MOS 115 is turned on, the low beam LED 102*a* and the high/low beam LED 102*b* are turned on, and the high beam LED 102*c* is turned off. As a result, the LED 102 displays a low beam distribution pattern (not shown) by low beam converging light and diffused light.

On the other hand, when the lighting switch 110 is turned on and the high beam/low beam changeover switch 111 is turned on, the lighting circuit 103 turns on and off the LED 102 in a mode (high beam setting) in which the high beam light distribution pattern is displayed. Specifically, in the high beam setting, the MOS 114 is turned on, and the MOS 115 is turned off. In this case, not only the high/low beam LED 102*b* and the high beam LED 102*c* are turned on, but also the low beam LED 102*a* receives a current which is weaker than a lighting current for full lighting via the resistor 113, is turned on with brightness slightly reduced as compared with that at the time of full lighting, and generates low beam converging light.

In the related art, it is necessary to cause a weak current for preventing oxidation to flow through a connector of a signal input portion on the circuit, and the weak current is a wasteful current that does not contribute in any way to lighting the head lamp. However, according to the circuit configuration of FIG. 9, the weak current for preventing oxidation is also used for the weak lighting of the low beam LED 102*a* at the time of high beam lighting, which has an effect of improving the poor appearance caused by turning off a part of the LEDs 102 when viewed from the front of the vehicle.

The invention claimed is:
1. A lamp unit comprising:
a light emitting element;
a lighting circuit;
a substrate; and
a heat dissipation member,
wherein the substrate includes a substrate main body, an external connector insertion portion, and a light emitting element installation portion, the heat dissipation member being provided in the substrate main body, the lighting circuit is mounted on the substrate main body, the lighting circuit being electrically connected with the light emitting element, the light emitting element is mounted on the substrate main body via the light emitting element installation portion, in a state of being in contact with the heat dissipation member, the external connector insertion portion is formed to protrude from an outer peripheral edge portion of the substrate main body, and the heat dissipation member is provided only on a back surface of the substrate main body.

2. The lamp unit according to claim 1,
wherein the light emitting element installation portion is a through hole penetrating the substrate from a front side to a back side of the substrate, and
the light emitting element is provided inside the light emitting element installation portion.

3. A lamp unit comprising:
a light emitting element;
a lighting circuit;
a substrate; and
a heat dissipation member,
wherein the substrate includes a substrate main body, and an external connector insertion portion, the heat dissipation member being provided only on a back surface of the substrate main body,
the lighting circuit is mounted on the substrate main body, the lighting circuit being electrically connected to the light emitting element via a metal conductive pattern disposed on a front surface of the substrate main body, in a state of being covered with an insulating resist, and
the external connector insertion portion includes an outer peripheral edge portion that is defined via a cutout portion, the external connector insertion portion being formed inside an outer frame of the substrate main body.

4. The lamp unit according to claim 3,
wherein the substrate main body includes a first component group mounting region defined on one end side of the external connector insertion portion, and a second component group mounting region defined on an other end side of the external connector insertion portion,
at least one first electronic component is mounted in the first component group mounting region of the substrate main body, the at least one first electronic component being a noise- compatible component, and
at least one second electronic component is mounted in the second component group mounting region of the substrate main body, the at least one second electronic component being a noise-incompatible component.

5. The lamp unit according to claim 3,
wherein an opening portion is provided in a part of the insulating resist covering the conductive pattern, and
the lamp unit further includes a check land that is the conductive pattern exposed through the opening portion.

6. The lamp unit according to claim 3,
wherein the light emitting element includes a light emitting portion, a light emitting substrate, and a terminal portion,
the light emitting substrate includes a step portion on a back surface side of the light emitting substrate, and
the light emitting element is mounted on the substrate main body via a light emitting element installation portion provided on the substrate, in a state where a back surface of the light emitting substrate is in contact with the heat dissipation member.

* * * * *